(12) United States Patent
Baik et al.

(10) Patent No.: US 9,119,303 B2
(45) Date of Patent: Aug. 25, 2015

(54) CURVATURE VARIER AND DISPLAY DEVICE COMPRISING THE SAME

(71) Applicant: LG Display Co., Ltd., Seoul (KR)

(72) Inventors: Sung Min Baik, Ansan-si (KR); Seok Hyo Cho, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/109,024

(22) Filed: Dec. 17, 2013

(65) Prior Publication Data
US 2015/0092353 A1    Apr. 2, 2015

(30) Foreign Application Priority Data

Oct. 1, 2013    (KR) ......................... 10-2013-0117103

(51) Int. Cl.
| | | |
|---|---|---|
| H05K 1/02 | (2006.01) | |
| G02F 1/1333 | (2006.01) | |
| H05K 5/00 | (2006.01) | |
| H05K 7/20 | (2006.01) | |
| G03B 21/58 | (2014.01) | |
| G03B 21/56 | (2006.01) | |

(52) U.S. Cl.
CPC .......... *H05K 1/028* (2013.01); *G02F 1/133305* (2013.01); *H05K 5/0017* (2013.01); *H05K 7/2039* (2013.01); *G03B 21/56* (2013.01); *G03B 21/58* (2013.01)

(58) Field of Classification Search
CPC .................... G02F 1/133305; G02F 1/133308; G03B 21/58
USPC ......................................................... 359/446
See application file for complete search history.

(56) References Cited

U.S. PATENT DOCUMENTS

| | | | | |
|---|---|---|---|---|
| 2005/0128173 | A1* | 6/2005 | Booh et al. ........................ | 345/87 |
| 2012/0105333 | A1* | 5/2012 | Maschmeyer et al. ......... | 345/173 |
| 2013/0329422 | A1* | 12/2013 | Park et al. ....................... | 362/233 |
| 2014/0104165 | A1* | 4/2014 | Birnbaum et al. .............. | 345/156 |
| 2014/0292674 | A1* | 10/2014 | Lee et al. ........................ | 345/173 |

* cited by examiner

*Primary Examiner* — Christ Mahoney
(74) *Attorney, Agent, or Firm* — Dentons U.S. LLP

(57) ABSTRACT

Disclosed is a display device having reduced noise during curvature varying. The display device includes a display module configured to display an image and a curvature varier configured to change a shape of the display module to a plane shape or a curvature shape with respect to a front surface of the display module. The curvature varier changes the shape of the display module to the plane shape or the curvature shape according to a shape change caused by a temperature.

18 Claims, 9 Drawing Sheets

CURVATURE VARIER AND DISPLAY DEVICE COMPRISING THE SAME

CROSS-REFERENCE TO RELATED APPLICATIONS

This application claims the benefit of the Korean Patent Application No. 10-2013-0117103 filed on Oct. 1, 2013, which is hereby incorporated by reference for all purposes as if fully set forth therein.

BACKGROUND OF THE INVENTION

1. Field of the Invention

The present invention relates to a display device for displaying an image. More particularly, the present invention relates to a display device in which a shape of a display module is changed to a plane shape or a curvature shape.

2. Discussion of the Related Art

Display devices display images. Examples of display devices include plasma display panels (PDPs), liquid crystal display (LCD) devices, electrophoretic display (EPD) devices, and organic light emitting display (OLED) devices.

Among the various display devices, OLED devices and EPD devices include a display module that is easily thinned and of which a curvature is flexibly varied.

A display module of a related art display device my be rounded with a certain curvature according to driving of a curvature varying apparatus that includes a motor, a rack gear, and a pinion gear or includes a motor, a wire, and a link. However, in the related art curvature varying apparatus, noise is caused by a physical friction between the motor, the rack gear, and the pinion gear or between the motor, the wire, and the link. Also, mechanical elements are worn due to physical friction between the mechanical elements. For these reasons, maintenance, such as replacement of the worn elements, is needed.

SUMMARY OF THE INVENTION

Accordingly, the present invention is directed to a display device that substantially obviates one or more problems due to limitations and disadvantages of the related art.

An aspect of the present invention is to provide a display device in which a curvature of a display module is varied without causing noise.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including: a display module configured to display an image; and a curvature varier configured to change a shape of the display module to a plane shape or a curvature shape with respect to a front surface of the display module, wherein the curvature varier changes the shape of the display module to the plane shape or the curvature shape according to a shape change caused by a temperature.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
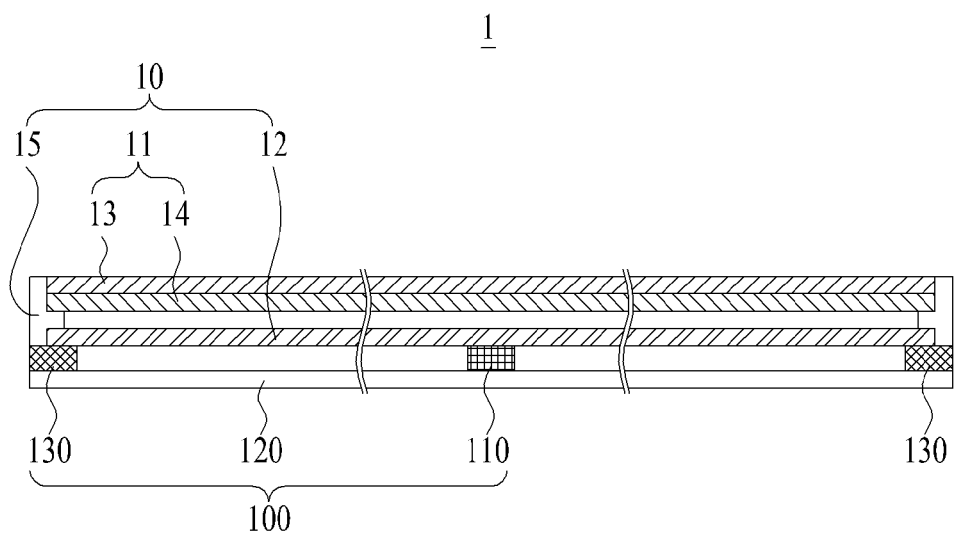
FIG. 1 is a schematic cross-sectional view describing a display device according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, an assembly apparatus for a display according to embodiments of the present invention will be described in detail with reference to the accompanying drawings.

Figure 2:
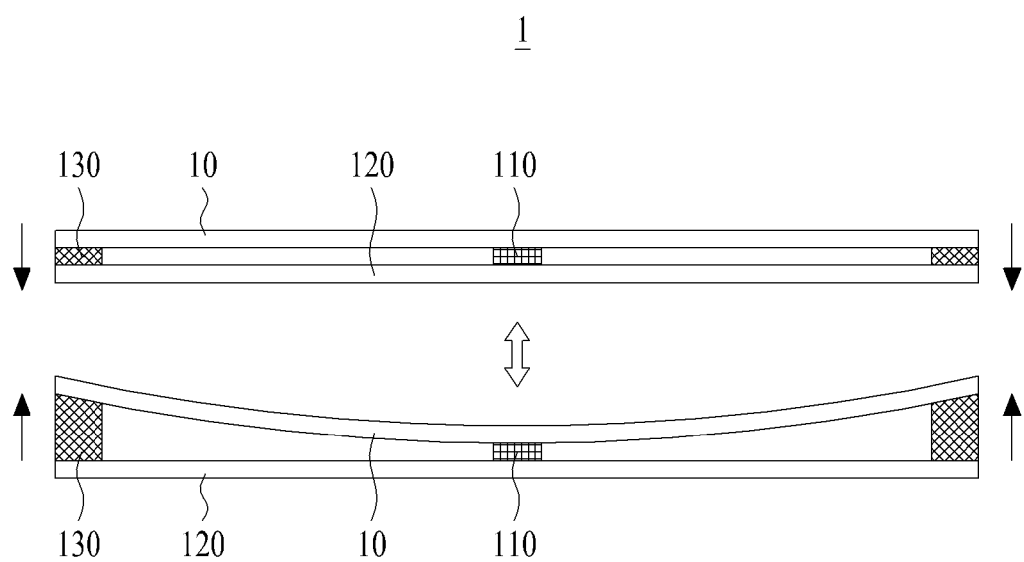
FIG. 2 is a plan view describing a curvature of a display module being varied.

FIG. 1 is a schematic cross-sectional view describing a display device 1 according to an embodiment of the present invention, and FIG. 2 is a plan view describing a curvature of a display module being varied.

Referring to FIGS. 1 and 2, the display device 1 according to an embodiment of the present invention includes a display module 10 that displays an image and a curvature varier 100 that changes a shape of the display module 10 to a plane shape or a curvature shape with respect to a front surface of the display module 10. The curvature varier 100 changes the shape of the display module 10 to the plane shape or the curvature shape according to a temperature, and in more detail, a shape being changed by the temperature.

The display module 10 may be implemented in various structures depending on the types of display devices such as LCD devices, EPD devices, and OLED devices.

The display module 10 according to an embodiment may include a first substrate 13 in which a plurality of pixels including an organic light emitting element are formed, and a second substrate 14 that is facing and coupled to the first substrate 13.

The display module 10 according to another embodiment may include: a display panel 11 that includes the first substrate 13 in which the plurality of pixels including the organic light emitting element are formed, and the second substrate 14 that is facing and coupled to the first substrate 13; a supporting cover 12 that is disposed at a rear surface of the display panel 11; and a supporting case 15 that supports a rear edge portion of the display panel 11, and surrounds side surfaces of the display panel 11 and side surfaces of the supporting cover 12.

The curvature varier 100 may be disposed at a rear surface of the second substrate 14 of the display module 10 according to an embodiment, or may be disposed at a rear surface of the supporting cover 12 of the display module 10 according to another embodiment.

Figure 3:
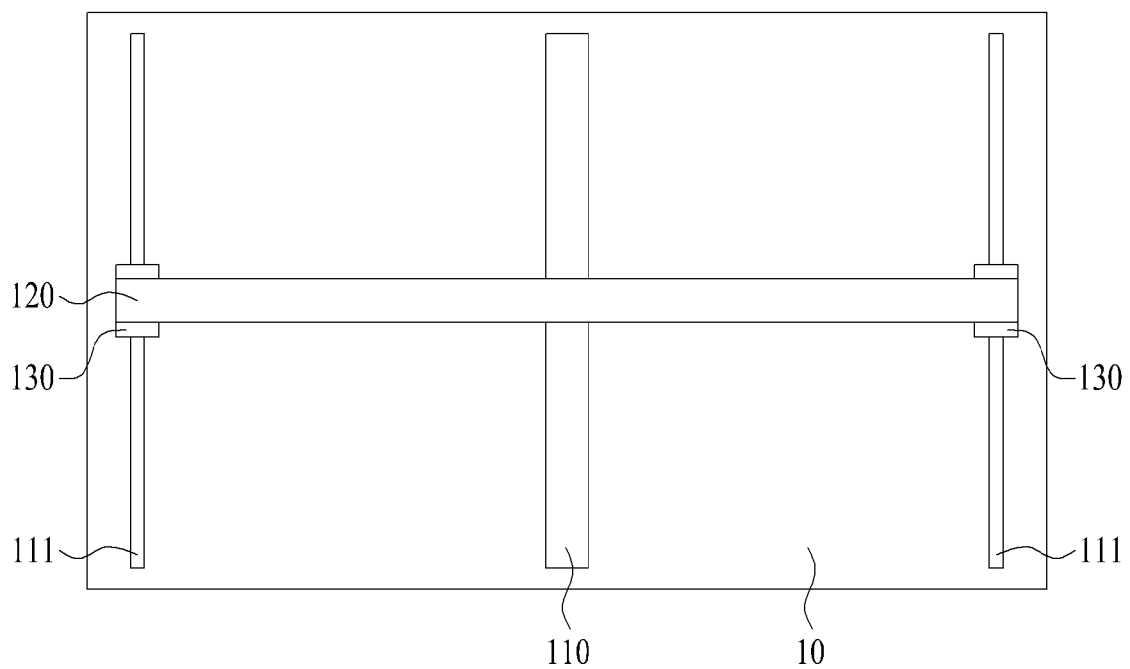
FIG. 3 is a schematic rear view describing two curvature varying units provided at the display module.
Figure 4:
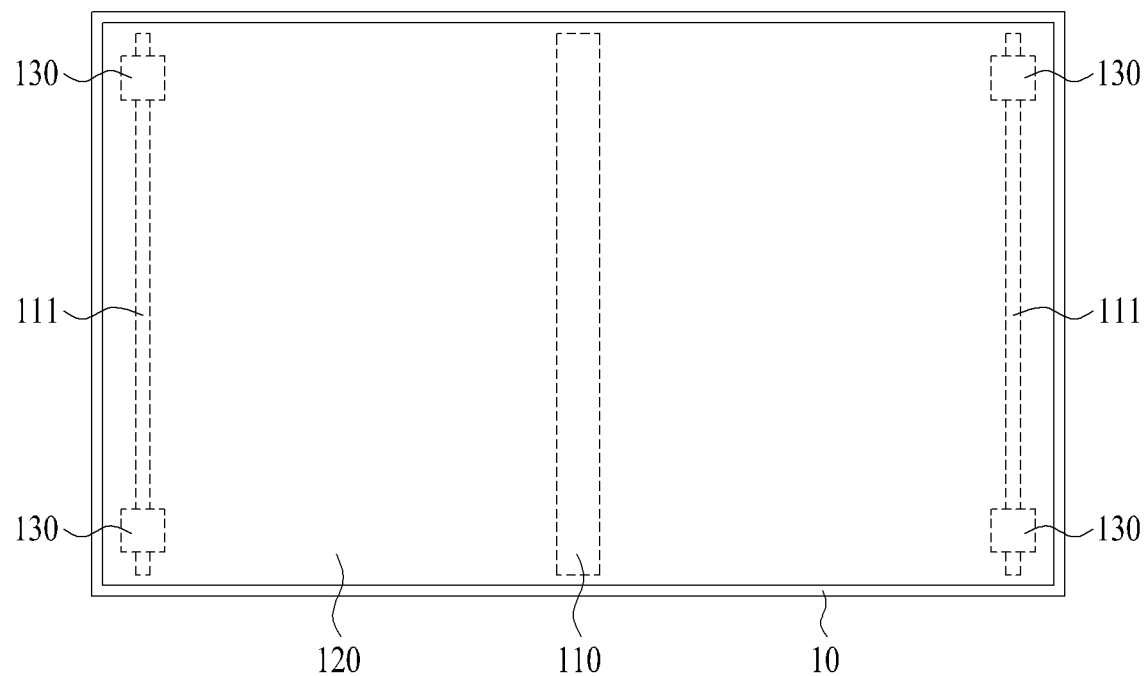
FIG. 4 is a schematic rear view describing four curvature varying units provided at the display module.

FIG. 3 is a schematic rear view for describing two curvature varying units provided at the display module, and FIG. 4 is a schematic rear view for describing four curvature varying units provided at the display module.

Referring to FIGS. 1 to 4, the curvature varier 100 changes the display module 10 from the plane shape to the curvature shape or from the curvature shape to the plane shape according to a temperature change. To this end, the curvature varier 100 may include a vertical support 110, a horizontal support 120, and a curvature varying unit 130.

The vertical support 110 is vertically coupled to a rear surface of the display module 10. The vertical support 110 acts as a central axis of a curvature when changing the curvature of the display module 10. Alternatively, when the vertical support 110 is disposed at the center in a long side direction of the display module 10 to be parallel to a short side direction of the display module 10, shapes of a left portion and a right portion of the display module 10 may be changed to the plane shape or the curvature shape with the vertical support 110 as a curvature center axis.

The horizontal support 120 is disposed at the vertical support 110 to be opposite to the rear surface of the display module 10, and supports the curvature varying unit 130. In changing the curvature of the display module 10, the horizontal support 120 acts as a rest (or a supporting wall) of the curvature varying unit 130. The horizontal support 120 is vertically coupled to the vertical support 110 such that a plurality of the curvature varying units 130 may be respectively disposed at a left portion and a right portion with respect to the vertical support 110. For example, when two curvature varying units 130 are coupled to the display module 10 in parallel to each other, as illustrated in FIG. 3, the horizontal support 120 may be formed in a rod shape in order for both ends thereof to support the curvature varying unit 130. As illustrated in FIG. 4, when four curvature varying units 130 are respectively coupled to corners of the display module 10, the horizontal support 120 may be formed in a plate shape or an X-shape having a size similar to that of the display module 10.

The curvature varying unit 130 is provide in plurality at the horizontal support 120, and changes a shape of the display module 10 to the plane shape or the curvature shape. For example, the curvature varying unit 130 may be coupled to at least one of an upper side, a lower side, a left side, a right side, a left upper corner, a left lower corner, a right upper corner, and a right lower corner of the display module 10 to correspond to the curvature shape of the display module 10. Therefore, the plurality of curvature varying units 130 may be driven simultaneously, and the curvature of the display module 10 can be easily changed by more reinforced force.

The display device 1 according to the present invention may further include a pressurizing member 111, having a plate shape or a bar shape, which is disposed between the display module 10 and the curvature varying unit 130. Therefore, the curvature varying unit 130 is coupled to the display module 10 by using the pressurizing member 111. Even when the curvature varying unit 130 pressurizes only a portion of the display module 10, the pressurizing member 111 overall transfers an applied pressure to a portion contacting the pressurizing member 111 in the display module 10. Therefore, even when the display module 10 is provided to have a thin thickness, the pressurizing member 111 can prevent the display module 10 from being partially creased due to the applied pressure of the curvature varying unit 130, and enables the curvature of the display module 10 to be uniformly implemented.

Figure 5:
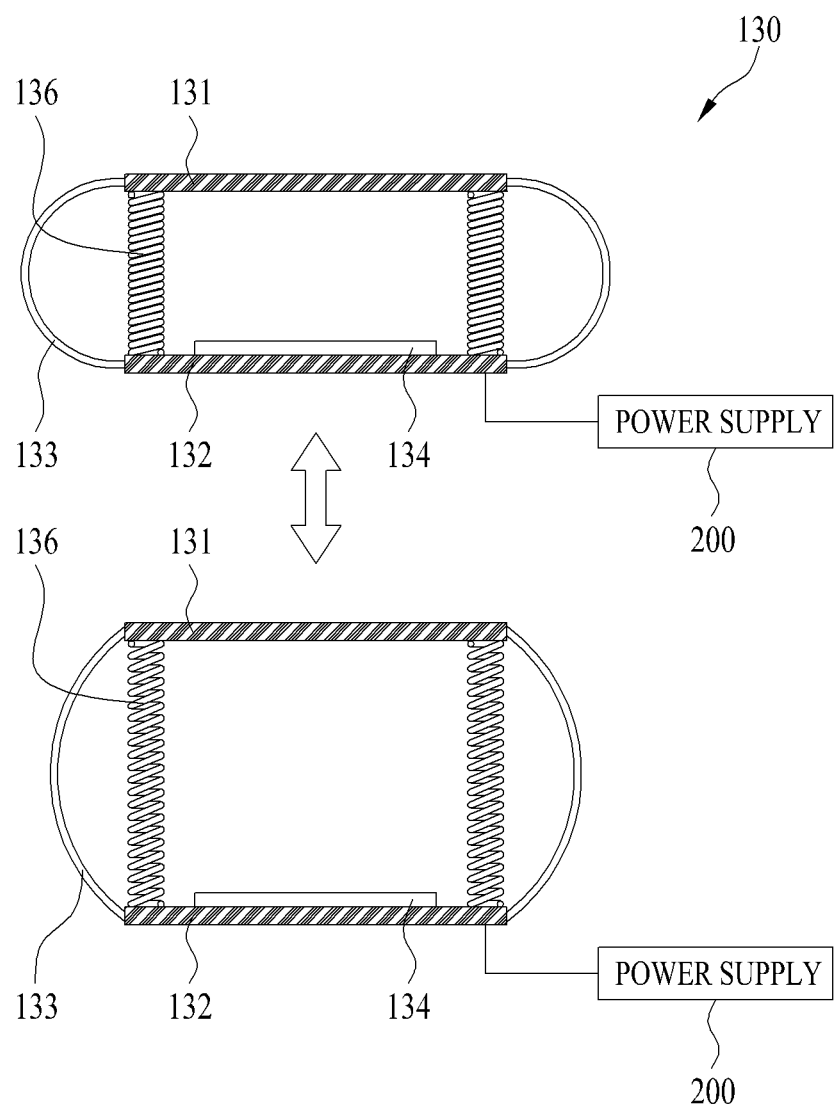
FIG. 5 is a cross-sectional view describing a curvature varying unit being expanded and contracted.

FIG. 5 is a cross-sectional view describing the curvature varying unit being expanded and contracted.

Referring to FIGS. 2 and 5, a shape of the curvature varying unit 130 is changed according to a temperature, thereby changing the shape of the display module 10. As a temperature increases, the curvature varying unit 130 changes the display module 10 from the plane shape to the curvature shape, and as a temperature decreases, the curvature varying unit 130 changes the display module 10 from the curvature shape to the plane shape. The curvature varying unit 130 may include a first plate 131, a second plate 132, a shape changing member 133, and a temperature adjusting member 134.

The first plate 131 is disposed at the rear surface of the display module 10, and the second plate 132 is disposed at the horizontal support 120. The interval between the first and second plates 131 and 132 may increase or decrease according to a shape of the shape changing member 133 being changed.

A shape of the shape changing member 133 is changed according to a temperature. The shape changing member 133 may be a shape memory alloy having properties of a shape memory effect in which when an alloy formed in the original shape is in the other shape, by returning to the original shape despite deformation of the alloy, a shape is restored to the original shape. General metals are not restored to the original shape by heating or cooling in a state of being deformed by force, but the shape memory alloy has a characteristic in which the shape memory alloy is deformed at a room temperature, and is heated at a certain temperature or more to return to the original shape.

By using the characteristic of the shape memory alloy, the shape changing member 133 according to the present invention has a certain curvature shape under the room temperature, and has a characteristic in which the shape changing member 133 is heated at a certain temperature or more to return to a linear shape. That is, when a temperature increases, a curvature of the shape changing member 133 is reduced, and when a temperature decreases, the curvature of the shape changing member 133 increases, thereby changing the interval between the first and second plates 131 and 132. Therefore, in the display device 1 according to the present invention, noise does not occur in a process of changing the curvature of the display module 10, and thus, elements are not worn, thereby increasing a service life.

Moreover, the shape changing member 133 may be provided in plurality between the first and second plates 131 and 132, and may separate the display module 10 from the horizontal support 120 by more reinforced force.

In the present specification, it has been described above that when a temperature increases, the curvature of the shape changing member 133 is reduced. However, when a temperature decreases, the curvature of the shape changing member 133 may increase.

Figure 6:
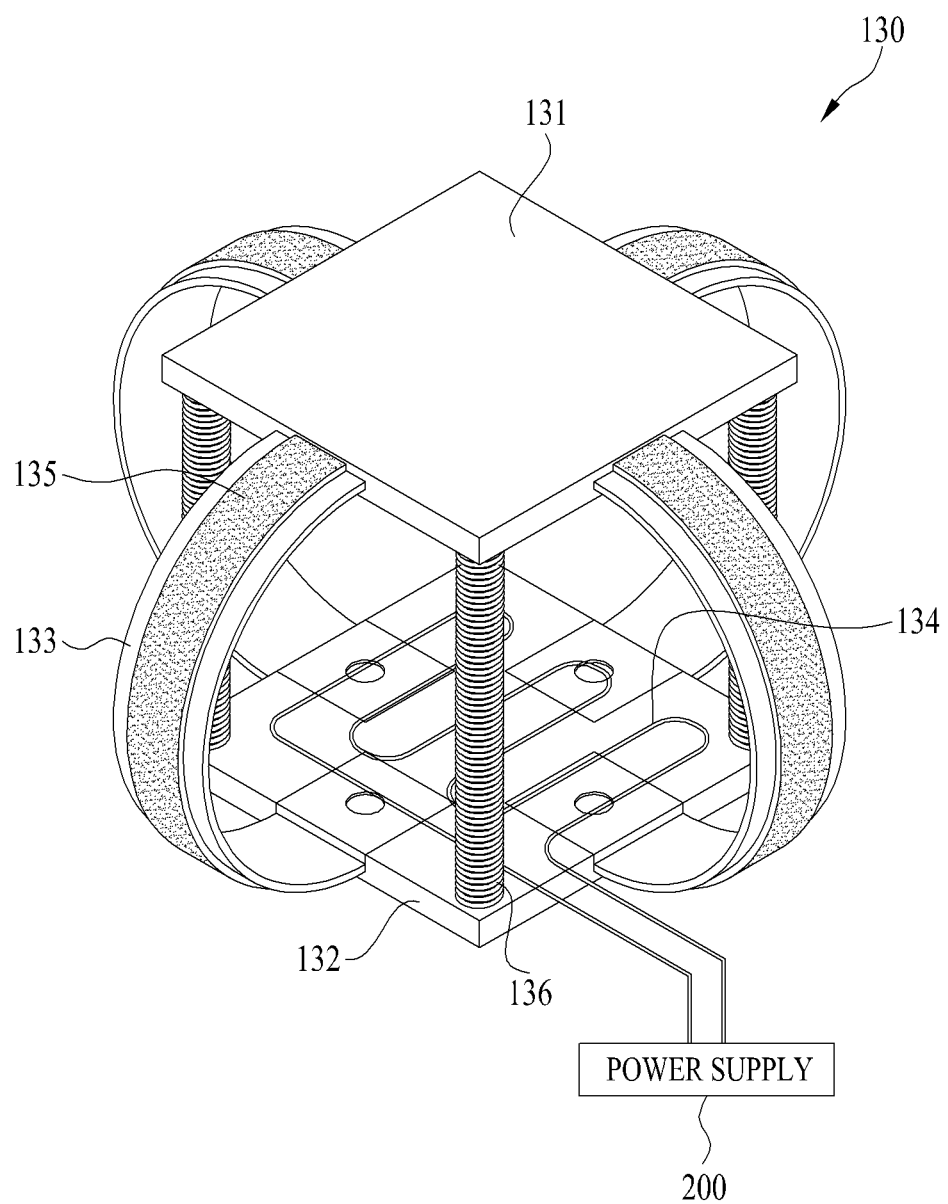
FIG. 6 is a perspective view describing a first embodiment of a curvature varying unit of which a temperature adjusting member is implemented with a heating wire.
Figure 7:
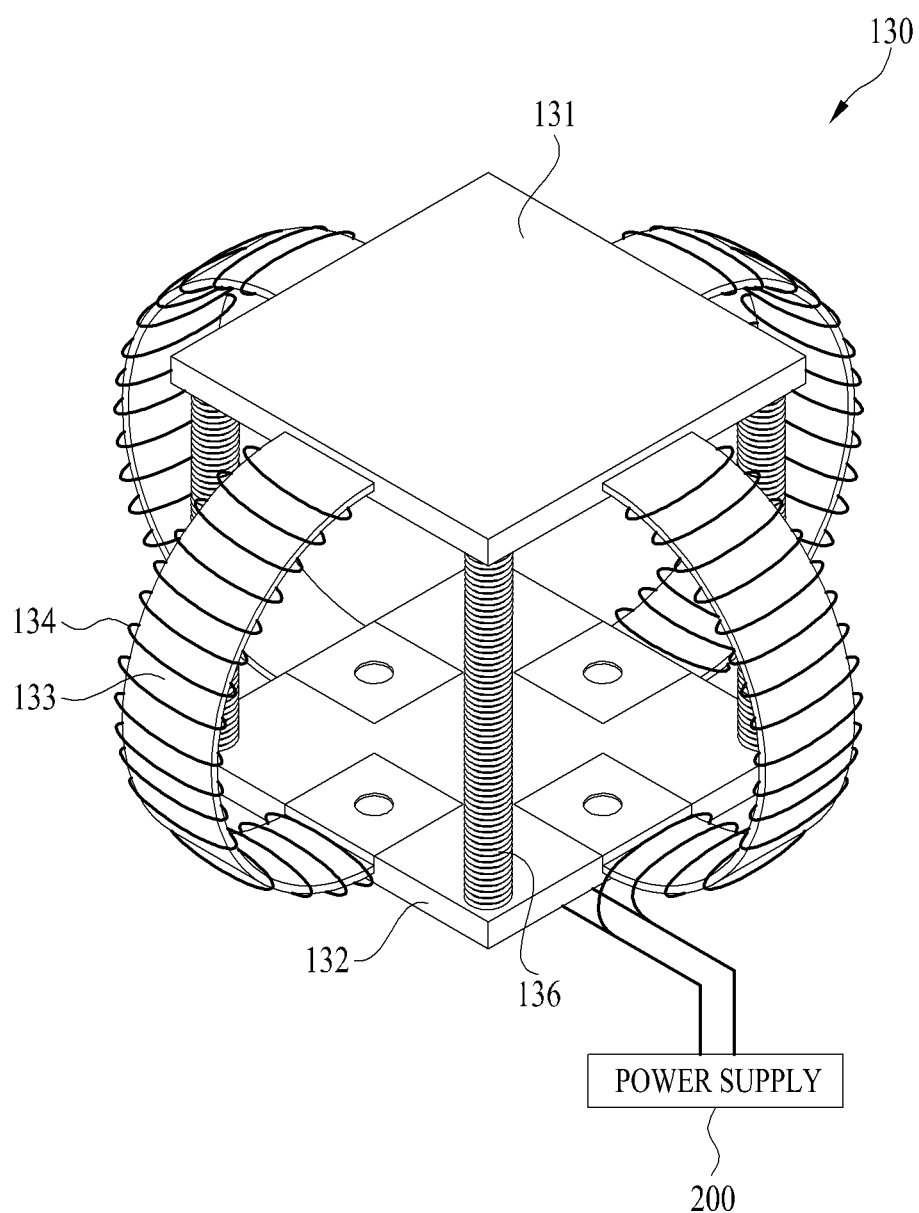
FIG. 7 is a cross-sectional view describing a second embodiment of a curvature varying unit of which a temperature adjusting member is implemented with a heating wire.

FIG. 6 is a perspective view describing a first embodiment of the curvature varying unit 130 of which the temperature adjusting member 134 is implemented with a heating wire, and FIG. 7 is a cross-sectional view for describing a second embodiment of the curvature varying unit 130 of which the temperature adjusting member 134 is implemented with a heating wire.

Referring to FIG. 6, the temperature adjusting member 134 is disposed at a top of the first plate 131 facing the second plate 132 or at a bottom of the second plate 132 facing the first plate 131, and heats the first plate 131 or the second plate 132 to change a temperature of a plurality of the shape changing members 133, thereby changing the curvature of the display module 10. The temperature adjusting member 134 may be a heating wire that generates heat with a current applied from a power supply 200 to increase the temperature of the shape changing member 133, and when a current is applied thereto, does not generate heat.

The curvature varying unit 130 may further include a heat transferring member 135 that transfers heat, generated by the temperature adjusting member 134, to the shape changing member 133. In this case, the heat transferring member 135 may be formed of a heat transferring sheet or film formed of a material having a high heat conductivity, and may be disposed at each of the plurality of shape changing members 133.

The temperature adjusting member 134 formed of the heating wire, as illustrated in FIG. 7, is disposed to surround an outer portion of the shape changing member 133, and generates heat with a current applied from the power supply 200 to directly heat the shape changing member 133. In this case, the heat transferring member 135 is not provided.

Figure 8:
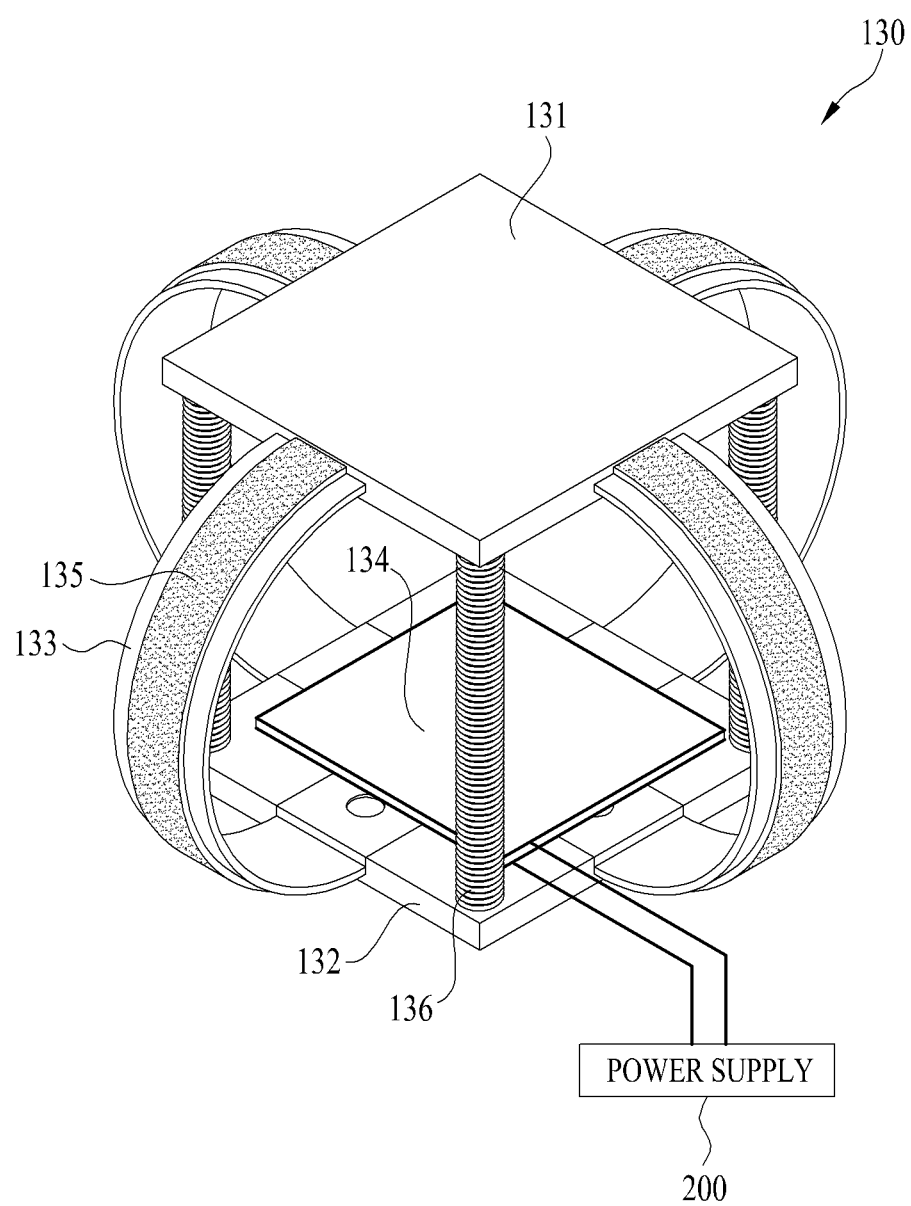
FIG. 8 is a perspective view describing a curvature varying unit of which a temperature adjusting member is implemented with a thermoelectric element.

FIG. 8 is a perspective view describing the curvature varying unit 130 of which the temperature adjusting member 134 is implemented with a thermoelectric element.

Referring to FIG. 8, the temperature adjusting member 134 may increase or decrease the temperature of the shape changing member 133 with power applied from the power supply 200. To this end, the temperature adjusting member 134 may be a thermoelectric element that heats or cools the first or second plate facing each other according to a direction of a current applied from the power supply 200. For example, when a forward current is supplied from the power supply 200, the thermoelectric element increases the temperature of the shape changing member 133 that is connected to a first electrode through heat generation by the first electrode. On the other hand, when a reverse current is supplied from the power supply 200, the thermoelectric element decreases the temperature of the shape changing member 133 that is connected to the first electrode through heat absorption by the first electrode. As a result, the temperature adjusting member 134 expands or contracts the curvature varying unit 130 according to a heat generation characteristic or a heat absorption characteristic of the thermoelectric element based on a direction of an applied current, thereby changing the shape of the display module 10 to the plane shape or the curvature shape.

The temperature adjusting member 134 may use a thermistor using a temperature change of an electrical resistance, an element using the Seebeck effect in which electromotive force is generated by a temperature difference, or a Peltier element using the Peltier effect in which heat is absorbed or generated with a current.

Even when the temperature adjusting member 134 is implemented with the thermoelectric element, the curvature varying unit 130 may further include the heat transferring member 135. Therefore, heat can be easily transferred from the heat transferring member 135 to the shape changing member 133.

Referring to FIGS. 5 to 8, the curvature varying unit 130 may further include a shape restoring member 136 that is disposed between the first and second plates 131 and 132 to restore the curvature shape of the display module 10 to the plane shape. The shape restoring member 136 pressurizes one end and the other end of the shape changing member 133 of which a curvature is reduced by an increase in a temperature, thereby increasing the curvature of the shape changing member 133. In this case, the shape restoring member 136 pressurizes the shape changing member 133 in a direction where the curvature of the shape changing member 133 increases. The shape changing member 136 is formed of an elastic material, and thus, a length of the shape changing member 136 is expanded or contracted.

Figure 9:
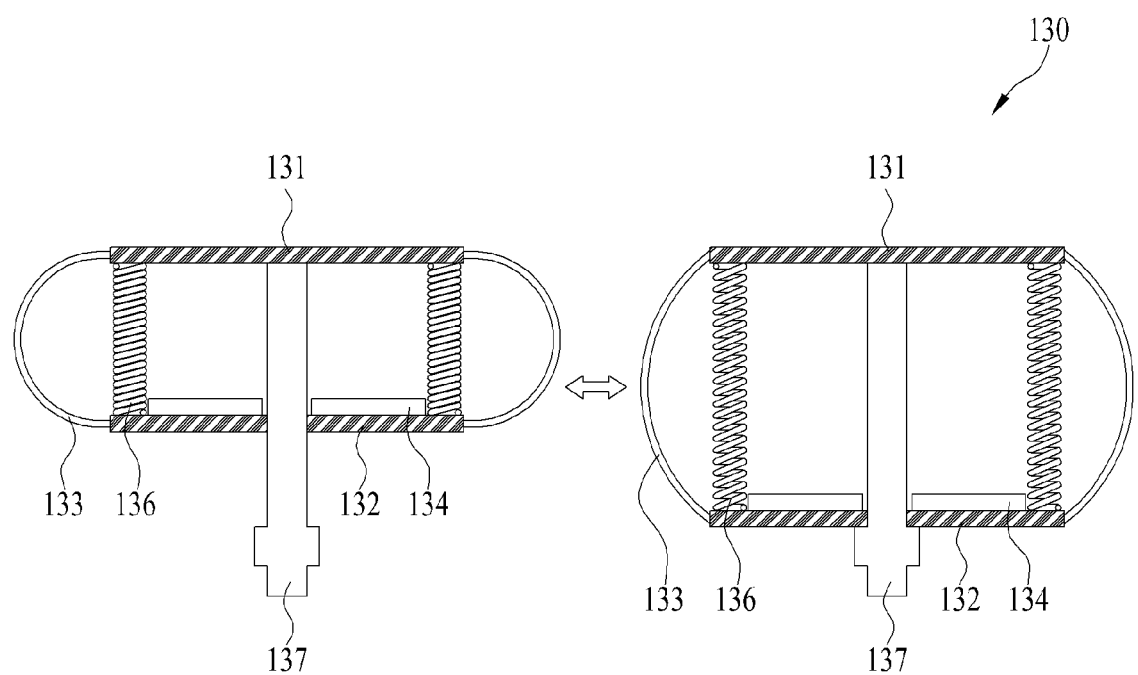
FIG. 9 is a cross-sectional view describing a stopper.

FIG. 9 is a cross-sectional view describing a stopper.

Referring to FIG. 9, the curvature varying unit 130 may further include a stopper 137 that is disposed between the first and second plates 131 and 132, and binds the curvature of the display module 10 changed to the curvature shape.

The stopper 137 may be coupled to the first plate 131, and may be disposed to pass through the second plate 132. The stopper 137 binds the interval between the first and second plates 131 and 132, thereby restricting the curvature of the display module 10 to a predetermined curvature or the maximum curvature.

Figure 10:
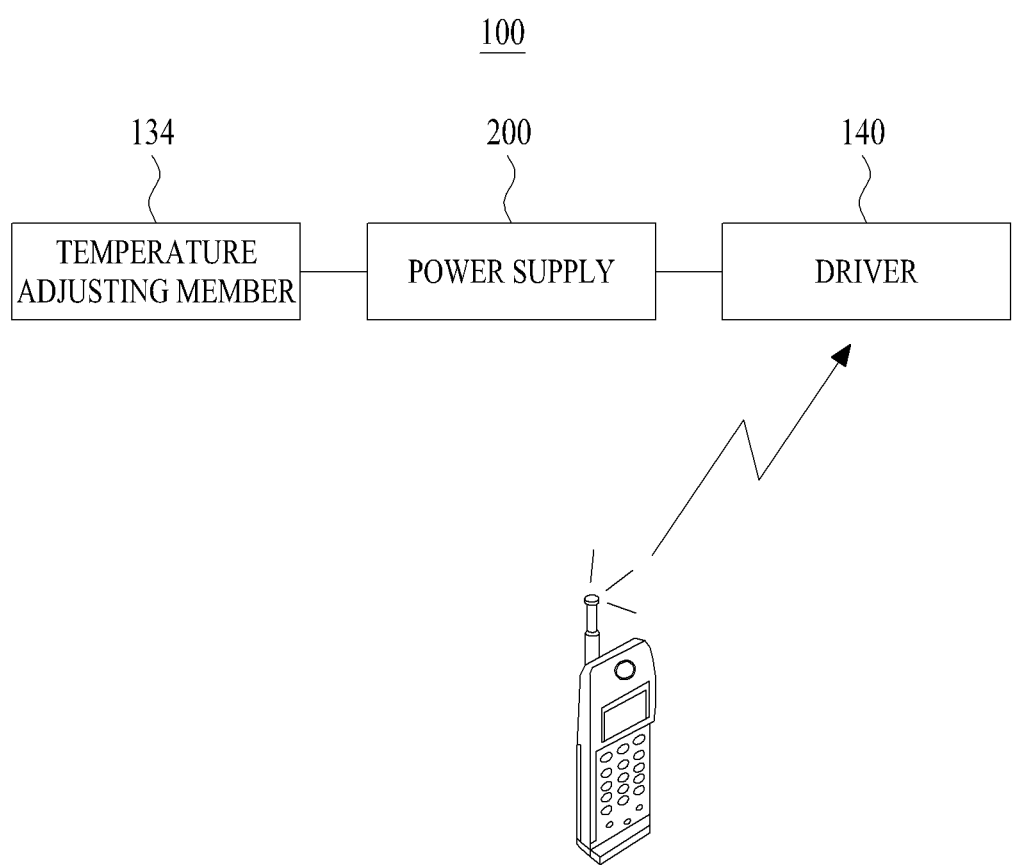
FIG. 10 is a block diagram describing a driver.

FIG. 10 is a block diagram describing a driver.

Referring to FIG. 10, the curvature varier 100 may further include a driver 140 that drives the temperature adjusting member 134 in response to a curvature varying signal based on a user's manipulation. Here, the curvature varying signal may be generated when the user manipulates a remote control apparatus for changing the shape of the display module 10 to the plane shape or the curvature shape. Therefore, the driver 140 receives the curvature varying signal transmitted from the remote control apparatus, and controls the power supply 200 according to the received curvature varying signal to adjust the temperature of the temperature adjusting member 134.

As described above, the present invention can prevent noise from occurring in a process of varying the curvature of the display module, and prevent an element from being worn, thus reducing maintenance work.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a display module configured to display an image; and
a curvature varier configured to change a shape of the display module to a plane shape or a curvature shape with respect to a front surface of the display module,
wherein the curvature varier changes the shape of the display module to the plane shape or the curvature shape according to a shape change caused by a temperature,
wherein the curvature varier includes:
a vertical support coupled to a rear surface of the display module;
a horizontal support disposed at the vertical support to be opposite to the rear surface of the display module; and
a plurality of curvature varying units disposed at the horizontal support.

2. The display device of claim 1, wherein each of the plurality of curvature varying units comprises:
a first plate disposed at the rear surface of the display module;
a second plate disposed at the horizontal support;
a plurality of shape changing members disposed between the first and second plates, a shape of each of the plurality of shape changing members being changed according to a temperature; and
a temperature adjusting member configured to change a temperature of each of the plurality of shape changing members.

3. The display device of claim 2, wherein the temperature adjusting member comprises a heating wire configured to generate heat with a current applied thereto.

4. The display device of claim 2, wherein the temperature adjusting member comprises a thermoelectric element configured to heat or cool the first or second plate according to a direction of a current applied thereto.

5. The display device of claim 2, wherein each of the plurality of curvature varying units further comprises a heat transferring member configured to transfer heat, generated by the temperature adjusting member, to the shape changing member.

6. The display device of claim 2, wherein each of the plurality of curvature varying units further comprises a shape restoring member disposed between the first and second plates to restore the curvature shape of the display module to the plane shape.

7. The display device of claim 2, wherein each of the plurality of curvature varying units further comprises a stopper disposed between the first and second plates to bind the curvature of the display module changed to the curvature shape.

8. The display device of claim 1, wherein the display module comprises:
a display panel configured to display an image; and
a supporting cover configured to support the display panel, and
the curvature varier is disposed at a rear surface of the supporting cover.

9. The display device of claim 1, wherein the curvature varier further comprises a driver configured to drive the temperature adjusting member in response to a curvature varying signal based on a user's manipulation.

10. A curvature varier for a display device comprising:
a vertical support coupled to a rear surface of the display module;
a horizontal support disposed at the vertical support to be opposite to the rear surface of the display module; and
a plurality of curvature varying units disposed at the horizontal support,
wherein each of the plurality of curvature varying units includes a plurality of shape changing members and a temperature adjusting member configured to change a temperature of each of the plurality of shape changing members.

11. The curvature varier of claim 10, wherein the each of the plurality of curvature varying units further comprises a first plate disposed at the rear surface of the display module and a second plate disposed at the horizontal support.

12. The curvature varier of claim 11, wherein the plurality of shape changing members are disposed between the first and second plates.

13. The curvature varier of claim 11, wherein the temperature adjusting member is disposed at the top of the first plate facing the second plate or at the bottom of the second plate facing the first plate.

14. The curvature varier of claim 10, wherein the each of the plurality of shape changing members comprises a shape memory alloy.

15. The curvature varier of claim 10, wherein the temperature adjusting member is formed of a heating wire.

16. The curvature varier of claim 15, wherein the temperature adjusting member is disposed to surround an outer portion of the shape changing member, and generates heat with a current applied from the power supply.

17. The curvature varier of claim 16, further comprising a driver configured to drive the temperature adjusting member in response to a curvature varying signal based on a user's manipulation.

18. The curvature varier of claim 10, wherein the temperature adjusting member comprises a thermoelectric element.

* * * * *